(12) United States Patent
Lee et al.

(10) Patent No.: US 7,043,383 B2
(45) Date of Patent: May 9, 2006

(54) FREQUENCY ERROR DETECTION APPARATUS AND METHOD BASED ON HISTOGRAM INFORMATION ON INPUT SIGNALS

(75) Inventors: Jae-wook Lee, Ohsan-si (KR); Jung-hyun Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 130 days.

(21) Appl. No.: 10/799,890

(22) Filed: Mar. 15, 2004

(65) Prior Publication Data

US 2004/0178936 A1    Sep. 16, 2004

(30) Foreign Application Priority Data

Mar. 14, 2003   (KR) ...................... 10-2003-0016025

(51) Int. Cl.
*G01R 23/00*        (2006.01)

(52) U.S. Cl. .......................... 702/78; 702/75; 702/180; 702/69; 702/189; 324/76.24; 324/76.41; 324/76.42

(58) Field of Classification Search .................. 702/78, 702/75, 76, 66, 69–71, 73, 74, 79, 106, 124–126, 702/180, 187, 189; 324/76.19, 76.24, 76.22, 324/76.39, 76.41, 76.42
See application file for complete search history.

(56) References Cited

U.S. PATENT DOCUMENTS

| 4,166,980 A | * | 9/1979 | Apostolos et al. ........... 375/316 |
| 6,598,004 B1 | * | 7/2003 | Ishida et al. .................. 702/69 |
| 6,931,335 B1 | * | 8/2005 | Mueller ....................... 702/69 |

OTHER PUBLICATIONS

Hsue et al., "Automatic modulation recognition of digitally modulated signals", Oct. 15-18, 1989, IEEE, Military Communications Conference, 1989, vol. 3, pp. 645-649.*

* cited by examiner

*Primary Examiner*—Hal Wachsman
(74) *Attorney, Agent, or Firm*—Sughrue Mion, PLLC (57) ABSTRACT

A frequency error detection apparatus and method based on histogram information of an input signal. The apparatus includes an A/D converter for and converting an analog signal into digital values; a zero crossing point detector for detecting sign changes of the digital values, and detecting zero crossing points; a period information detector for detecting period information which is the number of the digital values corresponding to a periodic signal; a histogram information calculator for counting the number of detections for the respective period information based on the period information, and calculating error-detection-target histogram information; and a frequency error calculator for detecting a difference between the error-detection-target histogram information and a reference histogram information, and calculating a frequency error value based on the difference. This can shorten time for frequency error detections and improve accuracy of the detected frequency error value.

14 Claims, 8 Drawing Sheets

FREQUENCY ERROR DETECTION APPARATUS AND METHOD BASED ON HISTOGRAM INFORMATION ON INPUT SIGNALS

CROSS-REFERENCE RELATED APPLICATIONS

This application claims the benefit of Korean Patent Application No. 2003-16025, filed on Mar. 14, 2003, in the Korean Intellectual Property Office, the disclosure of which is incorporated herein by reference.

BACKGROUND

1. Field of the Invention

Apparatuses and methods consistent with the present invention relate to an input-signal frequency error detection apparatus and a detection method thereof, and more particularly, to an input-signal frequency error detection apparatus and a detection method thereof calculating and analyzing histogram information on an input signal, and detecting frequency errors of the input signal.

2. Description of the Related Art

In general, when a signal reception system for communication equipment or data storage devices receives signals, the signal reception system detects a frequency of an RF signal transmitted from a signal transmission system, and synchronizes an operational frequency of the signal reception system with the frequency of the RF signal. A frequency synchronization circuit is needed for such frequency synchronization, and, in particular, for frequency synchronization circuits, a frequency detector is needed. In general, there exists an error between an operational frequency of a signal reception system and a frequency detected based on an RF signal inputted to a frequency detector, so a frequency error detection apparatus has been used to compensate for such an error.

Figure 1:
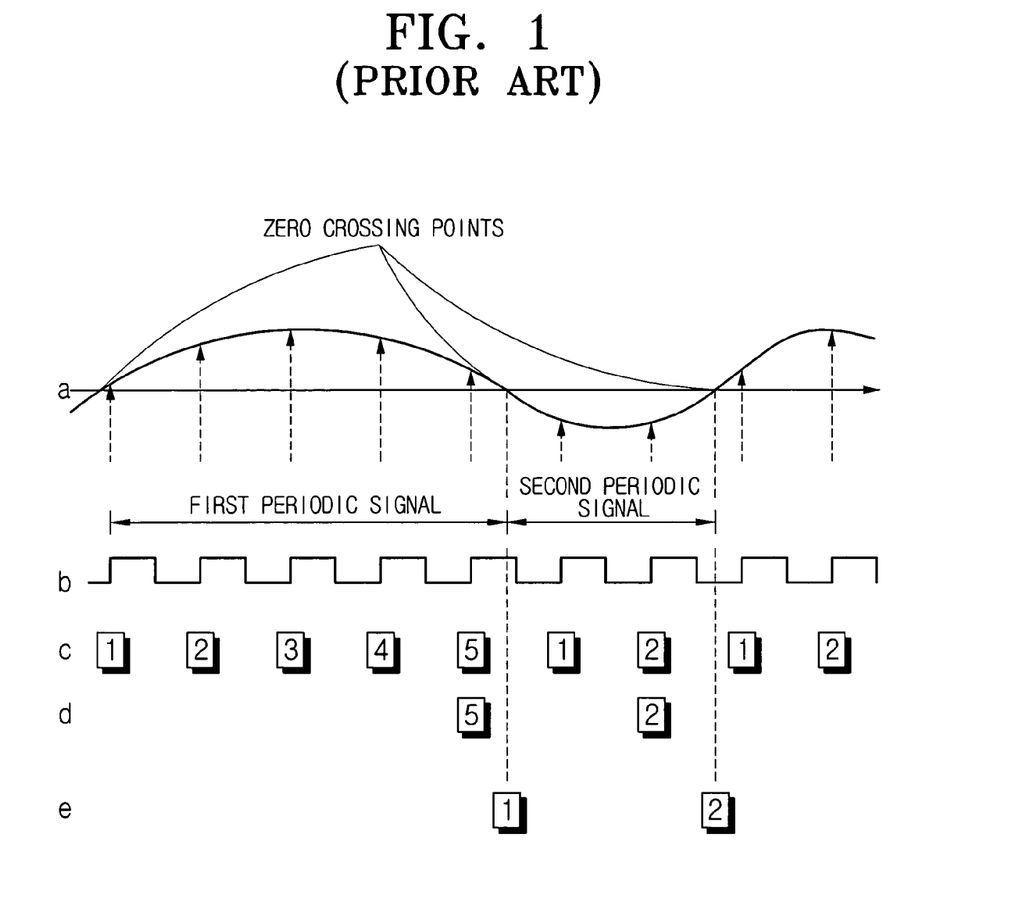
FIG. 1 is a view for showing timings for detecting period information on periodic signals of an input signal in the prior art.
Figure 2:
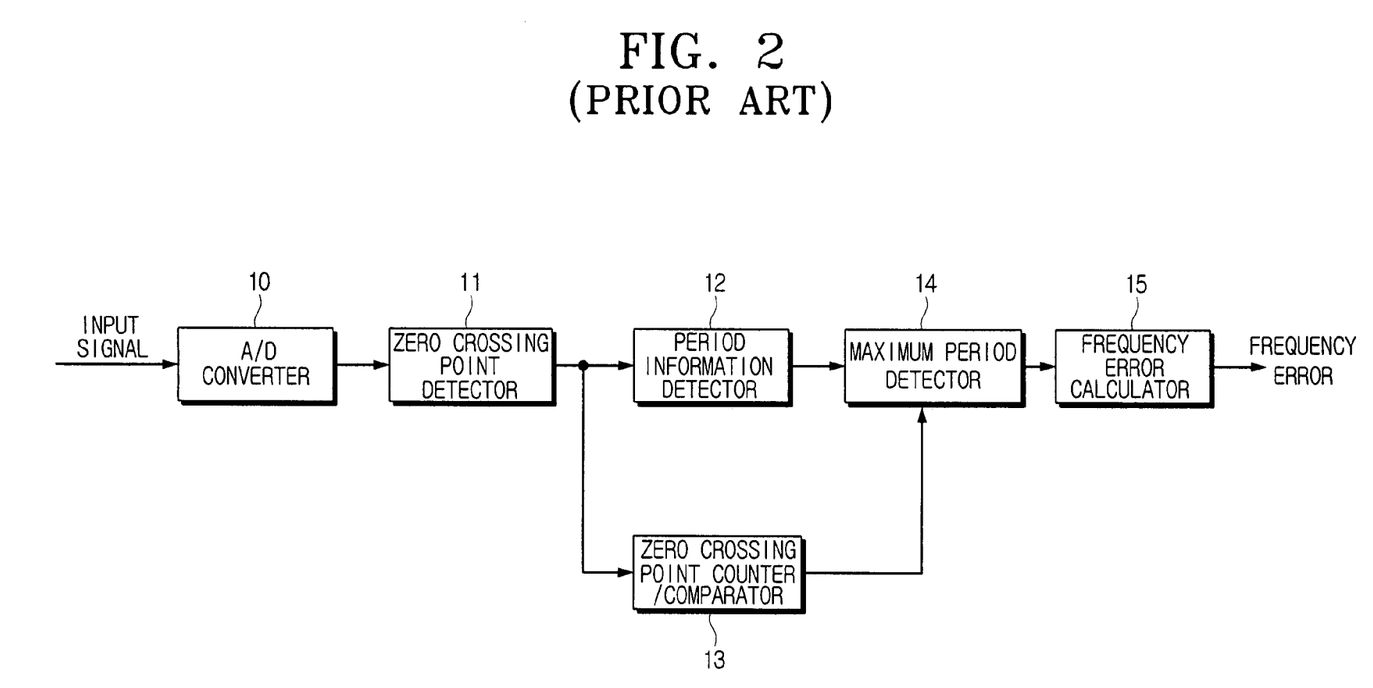
FIG. 2 is a block diagram for showing a conventional frequency error detection apparatus.

FIG. 1 is a view for showing timings for detecting period information on periodic signals of an input signal, and FIG. 2 is a block diagram for showing a conventional frequency error detection apparatus.

FIG. 1 indicates an input signal at 'a', and, in particular, the solid line indicates an inputted analog signal and the dotted lines indicate converted digital values. FIG. 1 also indicates data clocks at 'b', a process counting data clock periods at 'c', count result values of the data clock periods for a periodic signal at 'd', which indicate an interval between zero crossing points and is referred to as period information in the present disclosure, and count values of zero crossing points at 'e'.

Hereinafter, descriptions are made on a DVD system as an exemplary signal reception system to which a signal is inputted, for the convenience of explanations.

The conventional frequency error detection apparatus is provided in the DVD system, and includes an A/D converter 10, a zero crossing point detector 11, a period information detector 12, a zero crossing point counter/comparator 13, a maximum period detector 14, and a frequency error calculator 15.

The A/D converter 10 samples and converts an analog input signal into digital values for an output. For non-zero values, the digital values each have either a positive sign or a negative sign.

The zero crossing point detector 11 detects sign changes of the converted digital values so as to detect and output zero crossing points at which signal polarities are changed.

The period information detector 12 detects and outputs period information of a periodic signal based on the detected zero crossing points. Here, the period information as described above is referred to as the number of digital values corresponding to each periodic signal, or, in other words, referred to as the number of data clock periods corresponding to each periodic signal. In the embodiment shown in FIG. 1, a first periodic signal has period information of 5T, and a second periodic signal has period information of 2T.

The zero crossing point counter/comparator 13 counts the number of detected zero crossing points when the zero crossing points are detected. Further, the zero crossing point counter/comparator 13 decides whether the number of zero crossing points counted so far is equal to the number of error-detection-target, zero crossing points initially set. If equal, the zero crossing point counter/comparator 13 outputs a predetermined signal to the zero crossing point detector 11 in order for the zero crossing point detector 11 to stop detecting zero crossing points.

The maximum period detector 14 detects a periodic signal having maximum period information form detected period information. The DVD system has period information of 3T~11T for a periodic signal corresponding to data information, and has period information of 14T for a synchronization signal necessary for frequency synchronization. Accordingly, in the DVD system, a periodic signal having the period information of 14T is a period signal having the maximum period information and, at the same time, corresponds to a synchronization signal, and the maximum period detector 14 detects and outputs signal having the period information of 14T to the frequency error calculator 15.

The frequency error calculator 15 stores a reference synchronization signal detected in the normal state of the DVD system. Further, the frequency error calculator 15 calculates a difference value between the stored reference synchronization signal and an inputted periodic signal having the maximum period information, and calculates a frequency error value (FE) through a predetermined process based on the calculated difference value. The frequency of an input signal inputted in the DVD system is synchronized with the operational frequency of the DVD system based on the calculated frequency error value.

However, the DVD system detects a synchronization signal having predetermined period information inserted in every certain interval, i.e., in every 1488 bits of data. For example, the DVD system detects a periodic signal having 14 clock period information. The synchronization with the operational frequency of the DVD system is achieved based on the detected synchronization signal. Accordingly, the existing frequency error detection apparatus has to detect at least one synchronization signal in order to achieve the frequency synchronization of the DVD system, and needs to search a large number of intervals, for example, at least 1488 data intervals in order to detect at least one synchronization signal.

However, since most of the systems have to accomplish frequency synchronization within a short time, the time required for searching a large number of intervals causes a problem in the operations of the DVD systems.

Further, when the polarity changes of an input signal as in FIG. 1 are merely used in order to detect the period information of a synchronization signal, the polarities of digital values near zero crossing points may be detected to be opposite of the original polarities under circumstances in which noise is externally added. Accordingly, there is a problem in that the accuracy of frequency error detection can be degraded.

SUMMARY

The present invention has been devised to solve the above problems, so it is an aspect of the present invention to provide a frequency error detection apparatus and a detection method thereof based on histogram information on an input signal, which detect frequency errors of a synchronization signal together with a periodic signal for data information to thereby shorten a required time to detect a frequency error and to improve an accuracy of frequency error values.

It is another aspect of the present invention to provide a frequency error detection apparatus and a detection method thereof based on histogram information on an input signal, capable of selectively and automatically adjusting a required time to detect frequency errors and an accuracy of frequency error values by the necessity for a system.

In order to achieve the above aspect, a frequency error detection apparatus according to the present invention comprises an analog-to-digital (A/D) converter for sampling and converting an analog signal inputted to an electronic device requiring frequency synchronization into digital values of positive and negative signs; a zero crossing point detector for detecting sign changes of the converted digital values, and detecting zero crossing points at which sign polarities are changed; a period information detector for detecting period information which is the number of the digital values corresponding to a periodic signal being a signal between the detected zero crossing points; a histogram information calculator for counting the number of detections for the respective period information based on the detected period information, and calculating error-detection-target histogram information that is histogram information by period information; and a frequency error calculator for detecting a difference value between the detected error-detection-target histogram information and a reference histogram information on a signal frequency-synchronized with the electronic device, and calculating a frequency error value (FE) through a predetermined calculation process based on the detected difference value.

The frequency error detection apparatus further comprises a zero crossing point counter/comparator for counting the number of the detected zero crossing points, and controlling the zero crossing point detector based on whether the number of the counted zero crossing points is equal to the number of error-detection-target zero crossing points set for frequency error detections, wherein the zero crossing point detector stops detecting the zero crossing points by controls of the zero crossing point counter/comparator if the number of the counted zero crossing points is equal to the number of the error-detection-target zero crossing points.

In an exemplary embodiment, the frequency error detection apparatus further comprises a feedback part for calculating and outputting to the zero crossing point counter/comparator the number of error-detection-target zero crossing points based on the calculated frequency error value.

The feedback part includes an error detection mode mapping unit for mapping and detecting an error detection mode of plural error detection modes in correspondence to the calculated frequency error value; and an error-detection-target zero crossing point number assignment unit for assigning the number of the error-detection-target zero crossing points based on the detected error detection mode.

If the plural error detection modes consist of two modes and the calculated frequency error value is over a predetermined error value, the plural error detection modes are divided into a stabilization mode for assigning the number of the error-detection-target zero crossing points lower than a predetermined number for fast frequency error value detections, and a stable mode for assigning the number of the error-detection-target zero crossing points higher than the predetermined number for an accuracy of the frequency error value.

The frequency error calculator performs the calculations based on period information corresponding to an average value of the reference histogram information and maximum period information of the period information in the reference histogram information.

In an exemplary embodiment, the frequency error value is calculated by Equation 1 as follows:

$$FE = \left[ -\sum_{i=1}^{p}(ref_i - rec_i) + \sum_{i=p+1}^{q}(ref_i - rec_i) \right] \Big/ N \times 100, \quad \text{[Equation 1]}$$

where p denotes period information corresponding to an average value of reference histogram information, q is the maximum period information of the period information in the reference histogram information, $ref_i$ is the number of detections of the $i^{th}$ period information in the reference histogram information, $rec_i$ is the number of detections of the $i^{th}$ period information of the error-detection-target histogram information, and N is the total number of digital values used in a frequency error detection process.

Further, in order to achieve the above aspect, a frequency error detection method according to the present invention comprises steps of (a) sampling and converting an analog signal inputted to an electronic device requiring frequency synchronization into digital values of positive and negative signs; (b) detecting sign changes of the converted digital values, and detecting zero crossing points at which sign polarities are changed; (c) detecting period information which is the number of the digital values corresponding to a periodic signal being a signal between the detected zero crossing points;

(d) counting the number of detections for the respective period information based on the detected period information, and calculating error-detection-target histogram information that is histogram information by period information; and (e) detecting a difference value between the detected error-detection-target histogram information and a reference histogram information on a signal frequency-synchronized with the electronic device, and calculating a frequency error value (FE) through a predetermined calculation process based on the detected difference value.

The frequency error detection method further comprises a step of (f) counting the number of the detected zero crossing points, and controlling the step (b) based on whether the number of the counted zero crossing points is equal to the number of error-detection-target zero crossing points set for frequency error detections, wherein the step (b) stops detecting the zero crossing points if the number of the counted zero crossing points is equal to the number of the error-detection-target zero crossing points.

The frequency error detection method further comprises a step of (g) calculating and applying the step (f) the number of the error-detection-target zero crossing points based on the calculated frequency error value.

The step (g) includes steps of (g1) mapping and detecting an error detection mode of plural error detection modes in correspondence to the calculated frequency error value; and (g2) calculating the number of the error-detection-target zero crossing points based on the detected error detection mode.

If the plural error detection modes consist of two modes and the calculated frequency error value is over a predetermined error value, the plural error detection modes are divided into a stabilization mode for assigning the number of the error-detection-target zero crossing points lower than a predetermined number for fast frequency error value detections, and a stable mode for assigning the number of the error-detection-target zero crossing points higher than the predetermined number for an accuracy of the frequency error value.

In an exemplary embodiment, the step (e) performs the calculations based on period information corresponding to an average value of the reference histogram information and maximum period information of the period information in the reference histogram information.

Accordingly, the present invention can shorten a necessary time it takes to detect frequency errors, and improve an accuracy degree of frequency error values.

BRIEF DESCRIPTION OF THE DRAWINGS

The invention will be described in detail with reference to the following drawings in which like reference numerals refer to like elements, and wherein.

DETAILED DESCRIPTION OF THE EXEMPLARY EMBODIMENTS

Hereinafter, with reference to the accompanying drawings, descriptions will be made in detail of a frequency error detection apparatus and method based on histogram information on an input signal according to an embodiment of the present invention.

Figure 3:
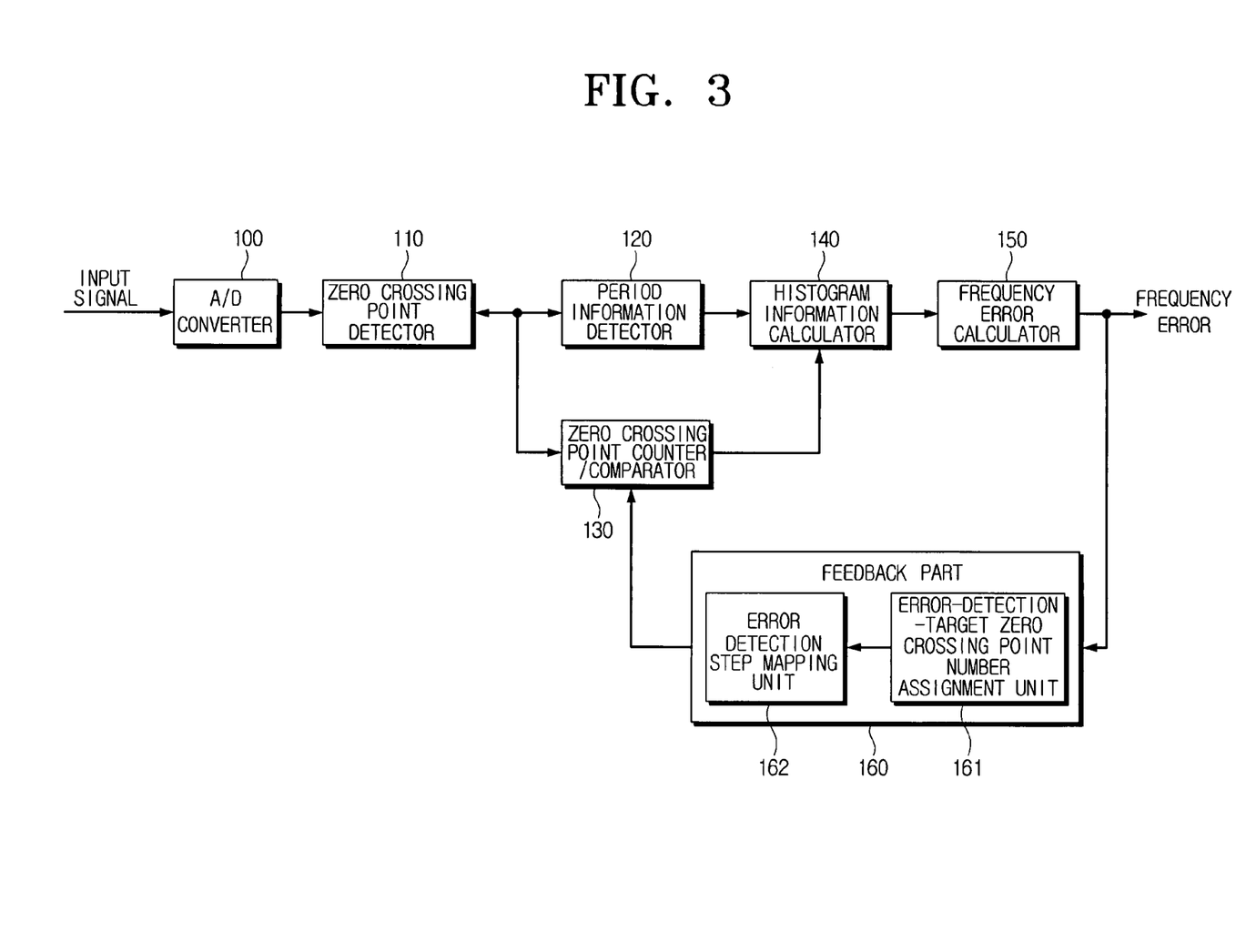
FIG. 3 is a block diagram for showing a frequency error detection apparatus according to an embodiment of the present invention.

FIG. 3 is a block diagram for showing a frequency error detection apparatus according to an embodiment of the present invention, and the frequency error detection apparatus according to the present invention includes an analog-to-digital (A/D) converter 100, a zero crossing point detector 110, a period information detector 120, a zero crossing point counter/comparator 130, a histogram information calculator 140, a frequency error calculator 150, and a feedback unit 160. The A/D converter 100, the zero crossing point detector 110, the period information detector 120, and the zero crossing point counter/comparator 130 perform the same or similar operations as those of the A/D converter 10, the zero crossing pointer detector 11, the period information detector 12, and the zero crossing point counter/comparator 13 shown in FIG. 2, so the descriptions on them will be omitted.

The histogram information calculator 140 counts the number of detections for the respective period information based on the period information detected from the period information detector 120, and calculates and outputs histogram information by the period information. Hereinafter, the calculated histogram information is referred to as error-detection-target histogram information.

The frequency error calculator 150 stores the reference histogram information detected in the normal state of the system. The frequency error calculator 150 calculates a difference value between the stored reference histogram information and the inputted error-detection-target histogram information, and calculates a frequency error value (FE) through a predetermined process based on the calculated difference value.

If period information corresponding to an average value of reference histogram information is denoted as p, maximum period information of the period information in the reference histogram information is denoted as q, the number of detections of the $i^{th}$ period information in the reference histogram information is denoted as $ref_i$, the number of detections of the $i^{th}$ period information of the error-detection-target histogram information is denoted as $rec_i$, and the total digital values used in a frequency error detection process is denoted as N, the frequency error value (FE) can be expressed in Equation 2 as follows:

$$FE = \left[ -\sum_{i=1}^{p}(ref_i - rec_i) + \sum_{i=p+1}^{q}(ref_i - rec_i) \right] \Big/ N \times 100 \quad \text{[Equation 2]}$$

Further, a signal inputted in the DVD system is synchronized with an operational frequency of the DVD system based on the calculated frequency error value.

Further, the calculated frequency error value is inputted to the feedback part 160 according to the present invention.

The feedback part 160 has an error detection mode mapping unit 162 and an error-detection-target zero crossing point number assignment unit 161.

The error detection mode mapping unit 162 is provided with a predetermined mapping table, and the mapping table preferably, but not necessarily, consists of frequency error values in a row of the table and error detection modes in a column of the table. The error detection mode mapping unit 162 uses the predetermined mapping table to calculate an error detection mode corresponding to an inputted frequency error value.

Here, the error detection mode can be divided into two or more modes in the DVD system, and the respective modes are distinguished based on the time required for detecting a frequency error value and an accuracy of the frequency error value. The present disclosure divides the modes into two modes of a stabilization mode and a stable mode for the sake of explanation, but the present invention is not limited to such modes. The stabilization mode is, in general, a mode corresponding to the initialization of the system, and has a calculated frequency error value above a predetermined error value, so the stabilization mode is a mode that is used when there is a need to calculate a frequency error value fast, even though accuracy is degraded. The stable mode, in general, indicates a case where a frequency error value calculated through a predetermined frequency error detection process is below a predetermined error value, so the stable mode is used when there is a need to calculate a precise frequency error value even though the time required for calculating a frequency error value becomes long.

The error-detection-target zero crossing point number assignment unit 161 calculates and outputs to the zero crossing point counter/comparator 130 the number of error-detection-target zero crossing points used for a subsequent frequency error value detection process based on an error detection mode calculated in the error detection mode mapping unit 162. The zero crossing point counter/comparator 130 inputs and uses the number of error-detection-target zero crossing points in detecting zero crossing points for calculating a frequency error value in a subsequent frequency error value detection process. If the stabilization mode is inputted, the number of error-detection-target zero crossing points lower than the number of current error-detection-target zero crossing points is calculated. Further, if the stable mode is inputted, the number of error-detection-target zero crossing points higher than the number of error-detection-target zero crossing points is calculated.

Figure 4:
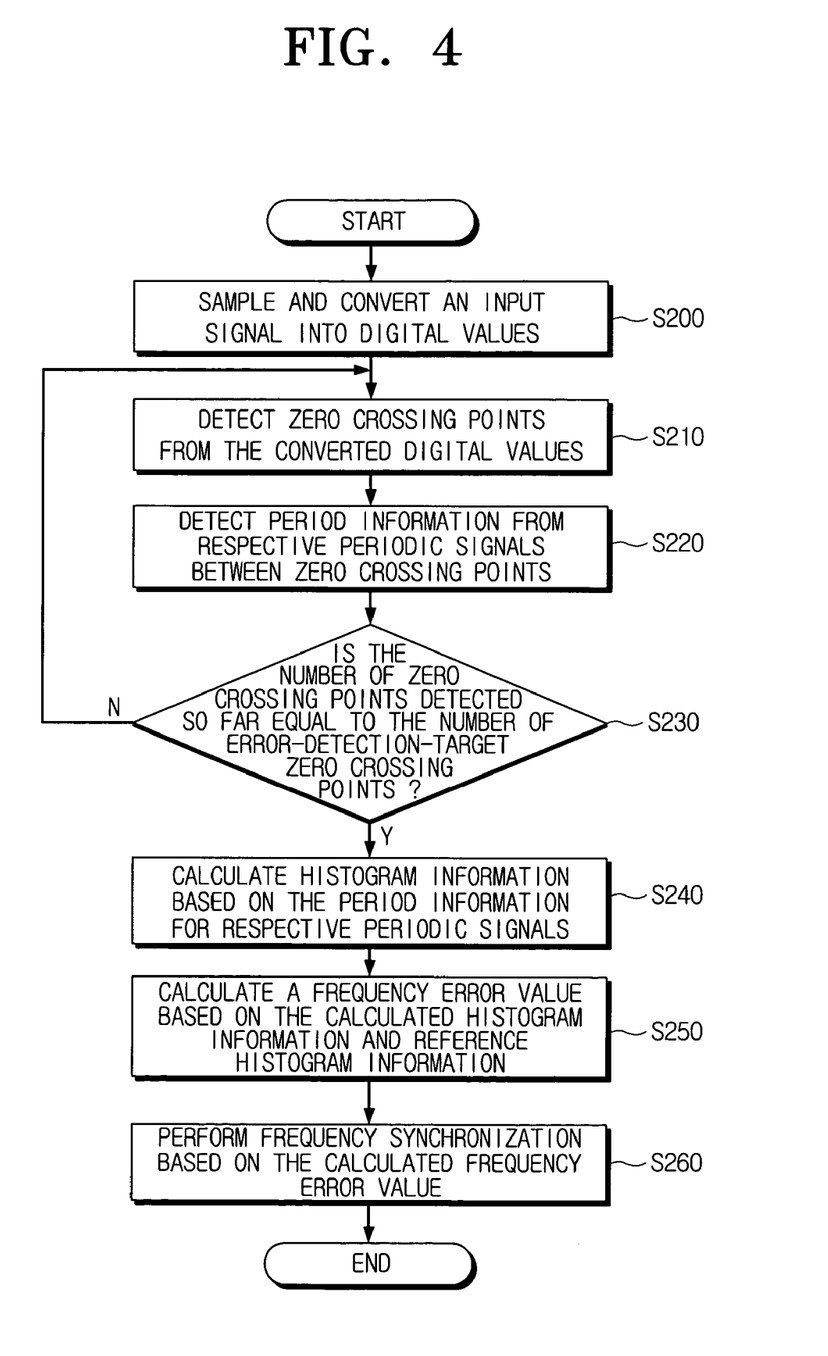
FIG. 4 is a flow chart for showing a process for detecting frequency error values in a frequency error detection method based on a histogram analysis of an input signal according to an embodiment of the present invention.
Figure 5:
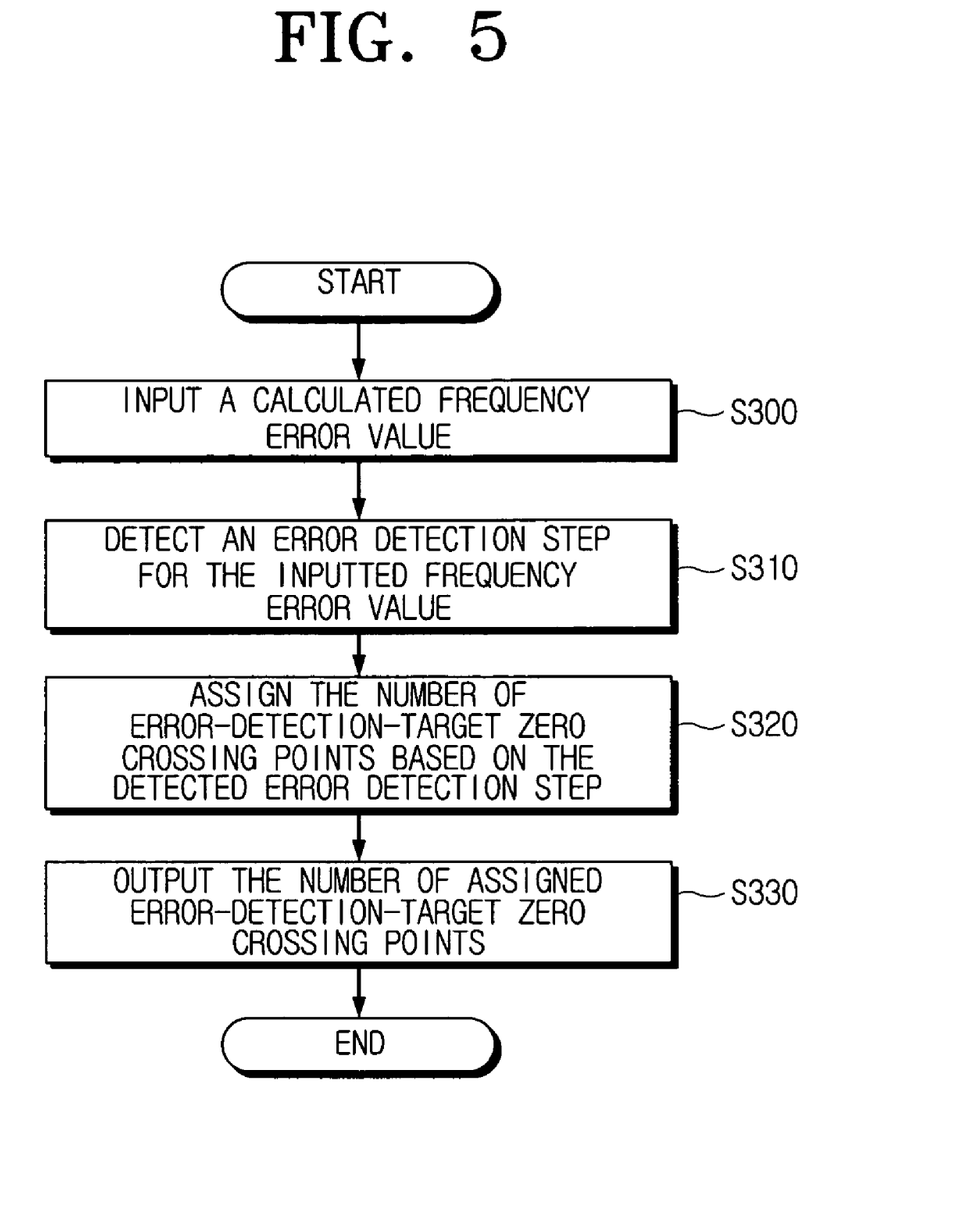
FIG. 5 is a flow chart for showing a process for calculating the number of error-detection-target zero crossing points based on the detected frequency error values in the frequency error detection method based on the histogram analysis of an input signal according to an embodiment of the present invention.

FIG. 4 is a flow chart for showing a process for detecting frequency error values in a frequency error detection method, and FIG. 5 is a flow chart for showing a process for calculating the number of error-detection-target zero crossing points based on a frequency error value detected in the frequency error detection method according to an embodiment of the present invention, and, hereinafter, descriptions will be made in detail with reference to FIG. 3 through FIG. 5.

First, if a signal is inputted to the A/D converter 100 according to the present invention, the A/D converter 100 samples and converts the input signal to digital values (S200). The converted digital values are outputted to the zero crossing point detector 110 to detect zero crossing points at which polarities are changed (S210). The period information detector 120 detects period information from a periodic signal between the zero crossing points based on the detected zero crossing points (S220). Further, the zero crossing point counter/comparator 130 counts the number of the zero crossing points based on the detected zero crossing points. The count result is the number of zero crossing points detected so far, and the zero crossing point counter/comparator 130 decides whether the count result is equal to the number of error-detection-target zero crossing points stored therein (S230). If equal as a result of the decision, the histogram information calculator 140 calculates histogram information by period information by using period information on each periodic signal based on the zero crossing points detected so far (S240). If not equal to each other, steps from S210 to S230 are repeated. Further, the frequency error calculator 150 calculates a frequency error value by using the calculated histogram information and the stored reference histogram information (S250), and synchronizes an operational frequency of the DVD system to a frequency of the input signal based on the calculated frequency error value (S260).

Further, the calculated frequency error value is inputted to the error detection mode mapping unit 162 of the feedback part 160 (S300), and the error detection mode mapping unit 162 detects an error detection mode corresponding to the inputted frequency error value (S310). The error-detection-target zero crossing point assignment unit 161 assigns the predetermined number of error-detection-target zero crossing points based on the detected error detected step (S320). The data for the assigned number of error-detection-target zero crossing points is outputted to the zero crossing point counter/comparator 130 (S330), updated in a storage area for the number of error-detection-target zero crossing points that is provided in the zero crossing point counter/comparator 130, and then used for a subsequent frequency error detection process.

Figure 6:
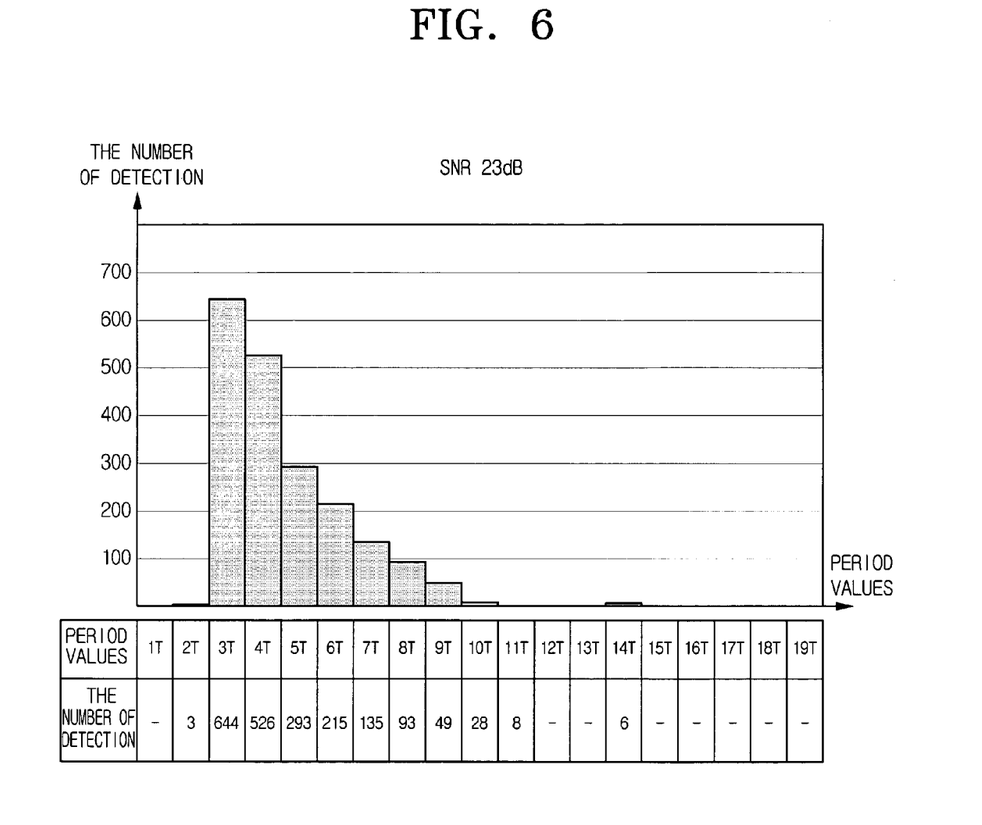
FIG. 6 is a view for showing histogram information for a reference input signal of 23-dB SNR calculated by the detection apparatus according to an embodiment of the present invention.
Figure 7:
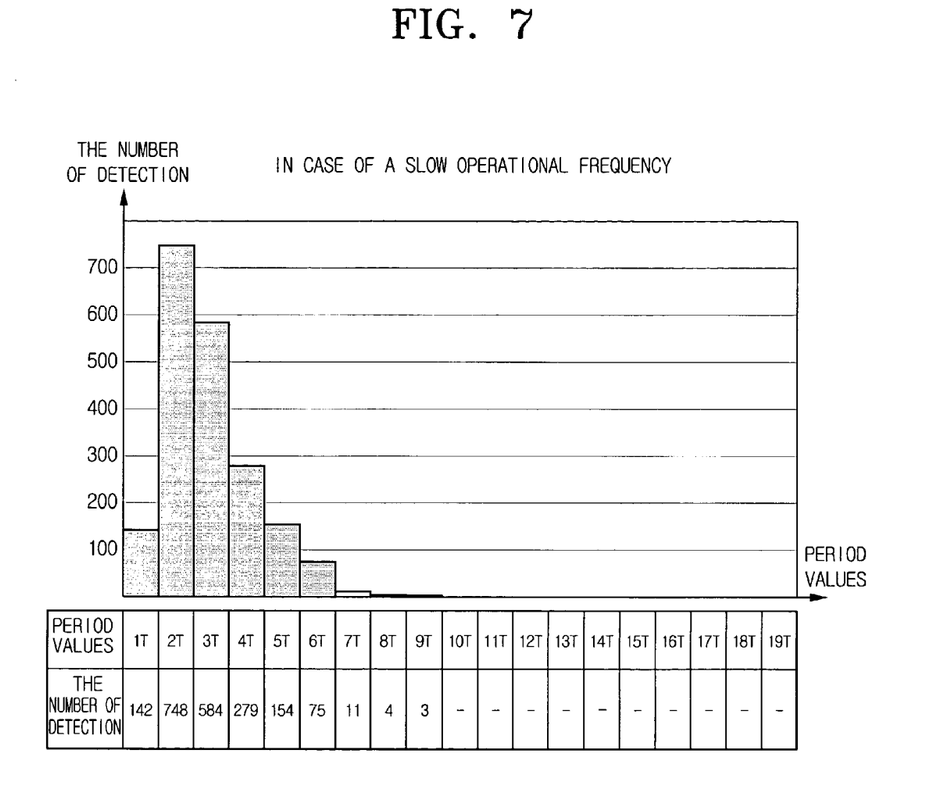
FIG. 7 is a view for showing histogram information on an input signal slower than the reference input signal of FIG. 6.
Figure 8:
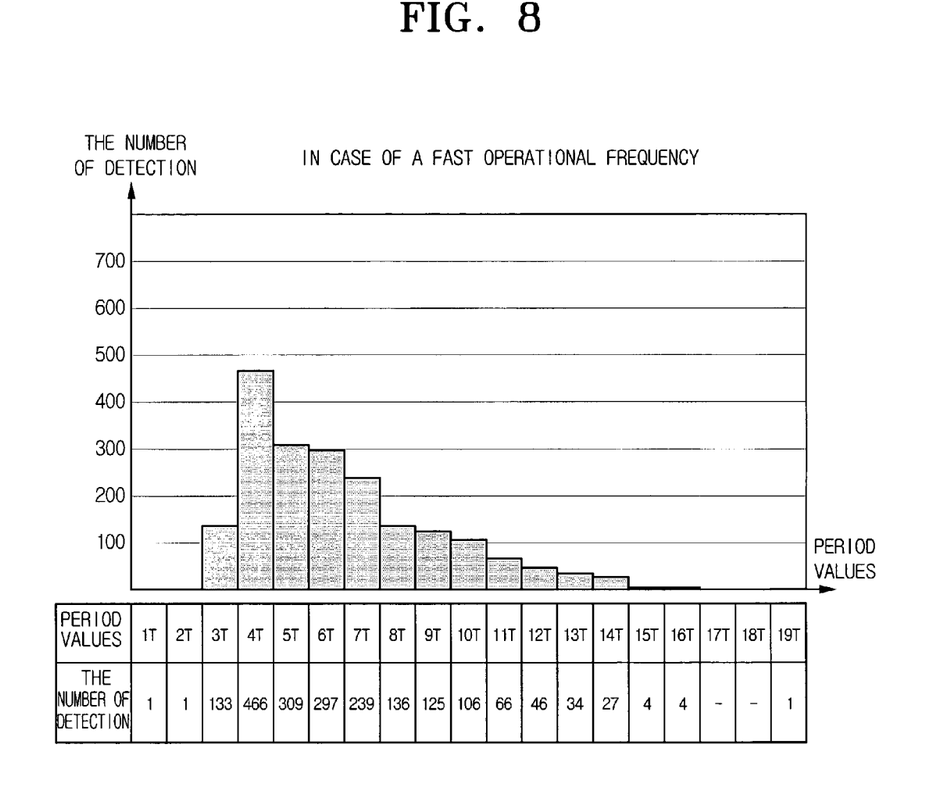
FIG. 8 is a view for showing histogram information on an input signal faster than the reference input signal of FIG. 6.

FIG. 6 is a view for showing histogram information for a reference input signal of 23-dB SNR calculated by the detection apparatus according to an embodiment of the present invention, FIG. 7 is a view for showing histogram information for an input signal slower than the reference input signal of FIG. 6, and FIG. 8 is a view for showing histogram information on an input signal faster than the reference input signal of FIG. 6.

In the present disclosure, descriptions will be made with an input signal of 23-dB SNR inputted to the DVD system as a reference input signal. Accordingly, the histogram information of an input signal shown in FIG. 6 corresponds to the histogram information of a reference input signal, and, at this time, a frequency of the reference input signal is synchronized with an operational frequency of the DVD system. The histogram information of FIG. 7 is the histogram information of an input signal operating 37.5% slower than the reference input signal, and the histogram information of FIG. 8 is the histogram information on an input signal operating 37.5% faster than the reference input signal. If an input signal having the histogram information of FIG. 7 is inputted to the detection apparatus according to the present invention, the input signal is calculated as having a frequency error value of +37.5% through the process of FIG. 4 and Equation 1, the DVD system compensates for the frequency error based on the frequency error value and synchronizes the operational frequency of the DVD system to the frequency of the input signal. Further, if an input signal having the histogram information of FIG. 8 is inputted to the detection apparatus according to the present invention, the input signal is calculated as having a frequency error value of −37.5% through the process of FIG. 4 and Equation 1, and the DVD system compensates for the frequency error based on the frequency error value and synchronizes the operational frequency of the DVD system to the frequency of the input signal. In the present embodiment, period information p corresponding to an average value of the reference histogram information in Equation 1 is set to 4, and the maximum period information q of the period information in the reference histogram information is set to 19.

The frequency error detection apparatus and method based on histogram information on an input signal according to the present invention detects frequency errors by using a synchronization signal as well as a periodic signal for data information, so that the apparatus and method can shorten the time it takes to detect frequency errors and improve an accuracy of detected frequency error values. Further, the apparatus and method can selectively and automatically adjust the time needed for the frequency error detections and the accuracy of the frequency error values by the necessity of a system.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A frequency error detection apparatus based on histogram information on an input signal, comprising:
an analog-to-digital (A/D) converter for sampling and converting an analog signal inputted to an electronic device requiring frequency synchronization, into digital values comprising positive and negative signs;
a zero crossing point detector for detecting sign changes of the digital values, and detecting zero crossing points at which signs of the digital values change;
a period information detector for detecting a period information which is a number of the digital values corresponding to a periodic signal, wherein the periodic signal is a signal between two of the detected zero crossing points;
a histogram information calculator for counting a number of detections of the period information, and calculating histogram information of the period information for periodic signals; and
a frequency error calculator for detecting a difference between the histogram information and a reference histogram information of a signal frequency-synchronized with the electronic device, and calculating a frequency error value (FE) based on the difference.

2. The frequency error detection apparatus as claimed in claim 1, further comprising a zero crossing point counter for counting a number of the zero crossing points, and controlling the zero crossing point detector based on whether the number of the zero crossing points is equal to a target number of zero crossing points set for frequency error detections,
wherein the zero crossing point detector stops detecting the zero crossing points upon receiving a control signal from the zero crossing point counter if the number of the zero crossing points is equal to the target number of the zero crossing points.

3. The frequency error detection apparatus as claimed in claim 2, further comprising a feedback part for calculating and outputting to the zero crossing point counter the number of zero crossing points based on the frequency error value.

4. The frequency error detection apparatus as claimed in claim 3, wherein the feedback part includes:
an error detection mode mapping unit for mapping and detecting an error detection mode of plural error detection modes in correspondence to the frequency error value; and
a target number assignment unit for assigning the target number of the zero crossing points based on the error detection mode.

5. The frequency error detection apparatus as claimed in claim 4, wherein the plural error detection modes comprise a stabilization mode and a stable mode, the stabilization mode assigning the target number of the zero crossing points to be lower than a first predetermined number for fast frequency error value detections when the frequency error value is above a predetermined error value, the stable mode assigning the target number of the zero crossing points to be higher than a second predetermined number for an accuracy of the frequency error value when the frequency error value is below the predetermined error value.

6. The frequency error detection apparatus as claimed in claim 1, wherein the frequency error calculator performs calculations based on a period information corresponding to an average value of the reference histogram information and maximum period information of the reference histogram information.

7. The frequency error detection apparatus as claimed in claim 6, wherein the frequency error value is calculated as follows:

$$FE = \left[ -\sum_{i=1}^{p} (ref_i - rec_i) + \sum_{i=p+1}^{q} (ref_i - rec_i) \right] / N \times 100,$$

where p denotes the period information corresponding to the average value of the reference histogram information, q denotes the maximum period information in the reference histogram information, $ref_i$ denotes a number of detections of an $i^{th}$ period information in the reference histogram information, $rec_i$ denotes the number of detections of the $i^{th}$ period information in the histogram information, and N denotes total digital values used in calculating the frequency error value.

8. A frequency error detection method based on histogram information on an input signal, comprising:
sampling and converting an analog signal inputted to an electronic device requiring frequency synchronization into digital values having positive and negative signs;
first detecting sign changes of the digital values, and detecting zero crossing points at which signs of the digital values change;
second detecting a period information which is a number of the digital values corresponding to a periodic signal, wherein the periodic signal is a signal between two of the detected zero crossing points;
first counting a number of detections of the period information, and calculating histogram information of the period information for periodic signals; and
third detecting a difference between the histogram information and a reference histogram information of a signal frequency-synchronized with the electronic device, and calculating a frequency error value (FE) based on the difference.

9. The frequency error detection method as claimed in claim 8, further comprising second counting a number of the zero crossing points, and controlling the first detecting based on whether the number of the zero crossing points is equal to a target number of zero crossing points set for frequency error detections, wherein the first detecting stops detecting the zero crossing points if the number of the counted zero crossing points is equal to the target number of the zero crossing points.

10. The frequency error detection method as claimed in claim 9, further comprising first calculating and applying the second counting of the target number of the zero crossing points based on the frequency error value.

11. The frequency error detection method as claimed in claim 10, wherein the first calculating and applying comprises:
mapping and detecting an error detection mode of plural error detection modes in correspondence to the frequency error value; and
second calculating the target number of the zero crossing points based on the error detection mode.

12. The frequency error detection method as claimed in claim 11, wherein the plural error detection modes comprise a stabilization mode and a stable mode, the stabilization mode assigning the target number of the zero crossing points to be lower than a first predetermined number for fast frequency error value detections when the frequency error value is above a predetermined error value, the stable mode assigning the number of the zero crossing points to be higher than a second predetermined number for an accuracy of the frequency error value when the frequency error value is below the predetermined error value.

13. The frequency error detection method as claimed in claim 8, wherein the third detecting performs calculations based on a period information corresponding to an average value of the reference histogram information and maximum period information of the reference histogram information.

14. The frequency error detection method as claimed in claim 13, wherein the frequency error value is calculated as follows:

$$FE = \left[ -\sum_{i=1}^{p} (ref_i - rec_i) + \sum_{i=p+1}^{q} (ref_i - rec_i) \right] \Big/ N \times 100,$$

where p denotes the period information corresponding to the average value of reference histogram information, q denotes the maximum period information in the reference histogram information, $ref_i$ denotes a number of detections of an $i^{th}$ period information in the reference histogram information, $rec_i$ denotes the number of detections of the $i^{th}$ period information in the histogram information, and N denotes total digital values used in calculating the frequency error value.

* * * * *